US007786670B2

(12) United States Patent
Veres et al.

(10) Patent No.: US 7,786,670 B2
(45) Date of Patent: Aug. 31, 2010

(54) ORGANIC LIGHT EMITTING DIODES

(75) Inventors: Janos Veres, Manchester (GB); Simon Dominic Ogier, Manchester (GB); Stephen George Yeates, Manchester (GB)

(73) Assignee: Merck Patent GmbH, Darmstadt (DE)

( * ) Notice: Subject to any disclaimer, the term of this patent is extended or adjusted under 35 U.S.C. 154(b) by 792 days.

(21) Appl. No.: 10/523,604

(22) PCT Filed: Jul. 30, 2003

(86) PCT No.: PCT/GB03/03292

§ 371 (c)(1), (2), (4) Date: Feb. 17, 2006

(87) PCT Pub. No.: WO2004/013920

PCT Pub. Date: Feb. 12, 2004

(65) Prior Publication Data

US 2006/0238117 A1   Oct. 26, 2006

(30) Foreign Application Priority Data

Aug. 6, 2002  (GB)  ................................. 0218202.0

(51) Int. Cl.
    *H01J 1/62*  (2006.01)
(52) U.S. Cl. ........................... 313/509; 445/24; 313/504
(58) Field of Classification Search ............. 445/24–25; 427/58, 64, 66, 532–535, 539; 345/76; 313/498–512; 315/169.1, 169.3; 428/690–691, 917; 438/26–29, 438/34, 82; 257/40, 72, 98–100, 642–643, 257/759
    See application file for complete search history.

(56) References Cited

U.S. PATENT DOCUMENTS

| 5,949,186 | A | 9/1999 | Nagayama et al. |
| 6,855,378 | B1 * | 2/2005 | Narang ........................ 427/553 |
| 6,922,020 | B2 * | 7/2005 | Pennaz et al. ............. 315/169.3 |
| 7,300,686 | B2 * | 11/2007 | Morii et al. ............... 427/421.1 |
| 2003/0015962 | A1 * | 1/2003 | Murasko et al. ............. 313/509 |
| 2003/0030706 | A1 * | 2/2003 | Jagannathan et al. ........... 347/85 |

(Continued)

FOREIGN PATENT DOCUMENTS

EP              0193820              9/1986

(Continued)

*Primary Examiner*—Peter J Macchiarolo
*Assistant Examiner*—Donald L Raleigh
(74) *Attorney, Agent, or Firm*—Morgan Lewis & Bockius LLP

(57) ABSTRACT

This invention relates to organic light emitting diodes (OLEDs) and to methods for their manufacture. The invention provides an OLED element or display which enables contrast to be produced in an image. In accordance with the invention a layer of ink is patterned as a blocking layer between two OLED layers. The ink reduces or prevents conduction, i.e. movement of charge, between the two OLED layers in that area of the device. The ink may be dark in color, e.g. black, to increase the contrast ratio of the OLED. The blocking layer is provided between any two layers in the OLED and blocks the charge movement in these areas. The blocking layer may comprise a multiplicity of ink dots, the density of which determines the extent to which conduction is hindered. The blocking layer may be produced as a "greyscale" pattern wherein the density of dots is varied across the pattern.

16 Claims, 7 Drawing Sheets

U.S. PATENT DOCUMENTS

| | | | |
|---|---|---|---|
| 2003/0035917 A1* | 2/2003 | Hyman | 428/67 |
| 2003/0035972 A1* | 2/2003 | Hanson et al. | 428/480 |
| 2003/0063052 A1* | 4/2003 | Rebh | 345/76 |
| 2003/0113579 A1* | 6/2003 | Sotoyama et al. | 428/690 |
| 2004/0018379 A1* | 1/2004 | Kinlen | 428/690 |

FOREIGN PATENT DOCUMENTS

| | | | |
|---|---|---|---|
| EP | 0 880 303 A1 | | 11/1998 |
| EP | 1 103 590 A2 | | 5/2001 |
| EP | 1 195 736 A | | 4/2002 |
| GB | 2367788 | | 4/2002 |
| JP | 7-335383 | | 4/1996 |
| JP | 10-270173 | | 10/1998 |
| JP | 2000-21577 | | 1/2000 |
| JP | 2002-021577 | * | 1/2000 |
| JP | 2000-173777 | | 6/2000 |
| JP | 2002-208490 | * | 7/2002 |
| WO | 99/21233 | | 4/1999 |
| WO | WO/02/061837 | * | 8/2002 |

* cited by examiner

Fig. 2(a)
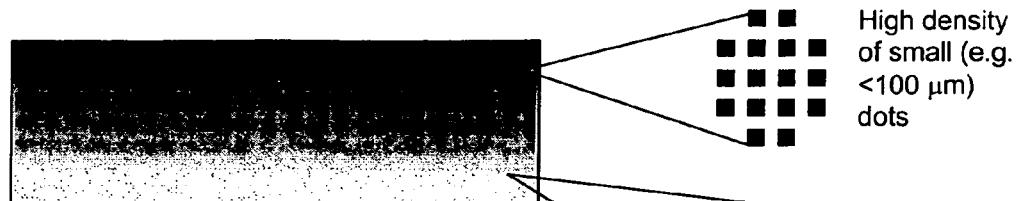
Fig. 2(b)
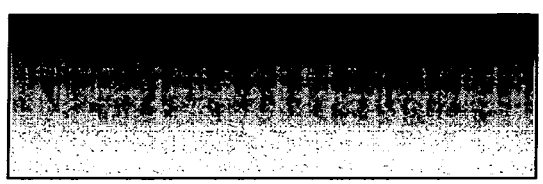
Figures 2 (a) and (b)
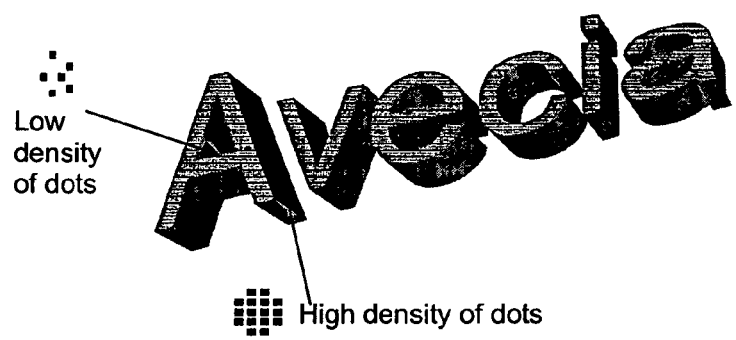
Figure 3

Aluminium deposited in these areas

ORGANIC LIGHT EMITTING DIODES

This invention relates to organic light emitting diodes (OLEDs), to methods for their manufacture and to their uses.

OLEDs have been attracting growing interest over the past decade. OLEDs are devices that generally comprise an organic electroluminescent material sandwiched between two electrodes. When an electrical current is applied the OLED radiates light generated by recombination of electrons and holes in the electroluminescent material. Plastic OLED devices based on light emitting polymers (LEP) or electroluminescent organic molecules make it possible to produce low cost, large area displays on flexible substrates, especially by solution coating. Low cost manufacturing, however, requires printing techniques that take advantage of the solution coatability of OLEDs.

The present invention provides an OLED element or display which enables contrast to be produced in an image and a method for the manufacture thereof.

In accordance with the present invention a layer of ink is patterned as a blocking layer between two OLED layers. The ink reduces or prevents conduction, i.e. movement of charge, between the two OLED layers in that area of the device, thus providing contrast in the image. The ink may be coloured. In one embodiment, preferably the ink is dark in colour, e.g. black, to increase the contrast ratio of the OLED. The ink may be coloured so as to provide a coloured background to the image. In this way, in one embodiment, areas in which the ink pattern exists may be of one colour whereas the illuminated image may have a different colour.

In more detail, in one aspect, the present invention provides a method of forming an OLED element or display having two or more OLED layers, which method comprises providing a blocking layer by printing with an ink in a desired pattern between two of the OLED layers, whereby, in use, conduction across the OLED element or display is reduced in the area of the pattern.

In one embodiment, the method comprises the steps of providing a first OLED layer, providing the blocking layer on top of the first OLED layer and providing a second OLED layer on top of the blocking layer.

The OLED layers are defined hereinafter.

The blocking layer is provided between any two layers in the OLED and blocks the charge movement in the area of the pattern. The blocking layer is typically located between the electroluminescent layer and either the anode or cathode of the OLED element or display. The blocking layer may directly contact the anode or the cathode. Alternatively, there may be present one or more additional layer(s) on the anode or cathode and the blocking layer may instead directly contact the additional layer. The additional layer(s) may comprise, for example, a hole injection layer or electron injection layer, such as a conductive material, e.g. a conductive polymer. The blocking layer may directly contact the electroluminescent layer or, alternatively, there may be one or more additional layer(s), such as hole or electron transport layer(s), between the blocking layer and the electroluminescent layer.

The blocking layer pattern may comprise a multiplicity of discrete points of the ink, such as dots, the density of which (i.e. the number of points per unit area) determines the extent to which conduction is hindered. The points may be each less than about 100 µm in size. The pattern may comprise regions with different densities of the discrete points such that some regions of the pattern may on average restrict conduction more than other regions. For example, regions of the pattern comprising a higher density of dots may restrict conduction to a greater extent whereas regions with a lower density of dots may restrict conduction to a correspondingly lesser extent. Such "grey-scale" patterning can be used to provide contrast in an image without need for sophisticated driving electronics such as active matrix transistor backplanes thus greatly reducing the cost of providing contrast in OLED displays. The grey-scale patterning, in use, can produce the appearance of a three-dimensional image on a two-dimensional OLED display.

The OLED elements may be used, for example, to manufacture multicolour displays, small or large area signs, logos or illuminating features.

The blocking layer of the desired pattern is preferably formed using an ink by printing. The term ink is used because of its capability of being printed rather than to mean that it must contain a colorant. However, the ink may contain colorant to increase the contrast ratio. Any material capable of being printed and which is preferably non-conducting may be used as the ink. The ink is preferably insoluble in the medium used to deposit earlier and/or subsequent OLED layer(s), i.e. underlying or overlying OLED layer(s). The ink medium is preferably a liquid which does not dissolve the layer on which the ink is printed. The ink medium can be either aqueous or non aqueous. For example, a water based ink is suitable on polymer surfaces that are insoluble in water, e.g. polyesters. The ink may be flexible in composition and include flow and other additives. When used with screen-printing applications, the ink can have a very high viscosity, up to 90,000 cp, preferably up to 70,000 cp, and more preferably between 500 and 10,000 cp. But when used with ink-jet printing, the ink viscosity is preferably in the range from about 0.7 to 100 cp, and more preferably from about 3 to 40 cp. The ink preferably has a surface tension from 20 to 70 dynes/cm, more preferably 20 to 60 dynes/cm. This will be governed both by the mode of printing, choice of inkjet printing head and the surface energy of the surface to be printed. Since good edge acuity is required then the surface tension of the ink relative to the substrate is preferably from 20 to 110 deg and more preferably 40 to 80 deg. For an inkjet ink the contact angle with the nozzle plate is preferably from 10 to 150 deg.

The ink may be either polar or nonpolar and the liquid medium of the ink preferably has a boiling point from 40° C. to 300° C. Preferred liquid media include, but are not limited to, water, alcohol, dioxane, glycols, cyclic amides, toluene, chloroform, tetrahydrofuran, dichlorobenzene, 1,2-dichloroethane, and xylene. The ink preferably contains from 50% to 99.8% liquid medium, by weight. Liquid medium mixtures are preferred to help control ink application properties such as latency, substrate wetting and drying time.

The ink may further comprise a colorant, a polymeric binder and/or functional additives which are used to modify the ink viscosity, surface tension, and latency. The ink preferably comprises a colorant to improve contrast in the image produced by the OLED element or display. A colorant may be included which gives the areas patterned by the ink a desired colour, different to the illuminated image. Suitable colorants for the ink composition include dyes or pigments such as carbon black. Non-black colorants may be used. Suitable polymeric binders for the ink composition include but not limited to acrylics, polyurethanes or silanes.

The ink may be deposited by a direct printing technique. Suitable direct printing techniques include: ink-jet printing, screen printing, microcontact printing, stamping, soft lithography or electrophotographic printing using a liquid or solid toner. The term ink used herein includes toner. In each case the ink is formulated to the appropriate viscosity, rheology and surface tension for the specific printing process. Ink-jet printing is particularly preferred. The use of ink-jet printing is advantageous because the same ink formulation and ink-jet head may be used, followed by the same chemical or mechanical process for the step, for the patterning of different layers thereby simplifying the hardware required. The printed ink is preferably thicker than the layer subsequently deposited onto it, this improves the efficiency of the step. The pattern is typically from 100 nm to 100 µm thick, preferably from 1 µm to 50 µm.

The OLED layer(s) to be deposited may be applied by a variety of coating and printing techniques. Examples include solution-, spin-, spray-, dip-, web-, die- or evaporation coating; electroless deposition and ink-jet printing, screen printing, microcontact printing, stamping or soft lithography. When the OLED layer is deposited by ink-jet printing, selective deposition on different areas is possible. For example, red, green and blue electroluminescent materials may be deposited on different areas.

The thickness of each OLED layer or multiplicity of layers may be from 1 nm (in case of a monolayer) to 10 µm, preferably from 1 nm to 1 µm, more preferably from 1 nm to 500 nm. The preferred deposition technique for the OLED layer(s) is a liquid coating technique, more preferably spin-, die- or spray-coating.

The use of a patterned blocking layer enables the OLED layer(s) to be applied with good uniformity of thickness. Even if variations in blocking layer thickness occur across the device the subsequent OLED layer(s) can be applied uniformly across the device, e.g. by a form of coating. Since the blocking layer provides a pattern, the OLED layer(s) can be simply coated on the device. The uniformity of OLED layer(s) yields improved image quality.

Various substrates may be used for the fabrication of OLEDs, plastics materials are preferred and examples include alkyd resins, allyl esters, benzocyclobutenes, butadiene-styrene, cellulose, cellulose acetate, epoxide, epoxy polymers, ethylene-chlorotrifluoro ethylene, ethylene-tetrafluoroethylene, fibre glass enhanced plastic, fluorocarbon polymers, hexafluoropropylenevinylidenefluoride copolymer, high density poly-ethylene, parylene, polyamide, polyimide, polyaramid, polydimethylsiloxane, polyethersulphone, polyethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, silicone rubbers, silicones. Preferred substrate materials are polyethyleneterephthalate, polyimide, and polyethylenenapthalate. The substrate may be any plastic material, metal or glass coated with the above materials. The substrate should preferably be homogenous to ensure good pattern definition.

The wetting of the ink formulation may be optimised by the surface treatment of the substrate, for example, by plasma treatment. Such treatment may also be used to enhance adhesion of the layer to be patterned to the substrate or improve edge acuity. As a result, the of the ink together with the layer above may be more efficient. The technique can be further optimised by using intermediate layers coated between the ink pattern and the layer to be patterned. Such layers can be used as barriers stopping the diffusion of ink into other layers.

The OLED comprises at least an anode (electron blocking layer or hole injection electrode), a cathode (hole blocking layer or electron injection electrode) and an electroluminescent layer, each of which may constitute an OLED layer as referred to herein. The OLED optionally comprises other layers such as a hole injection layer(s), a hole transport layer(s), an electron injection layer(s), an electron transport layer(s), a dopant or an insulator(s), all or any of which may constitute an OLED layer as referred to herein.

The electroluminescent layer is made up of substantially organic or organometallic electroluminescent materials. Suitable materials include organic photo- or electroluminescent, fluorescent and phosphorescent compounds of low or high molecular weight. Suitable low molecular weight compounds include, but are not limited to, substituted 9,9' spirobifluorenes (EP 0676461), Alq3 (an aluminum complex formed by coordination of three molecules of hydroxyquinoline with an aluminum atom), lanthanide complexes such as those of europium and ytterbium (WO 9858037), triplet emitters such as $Ir[2-PhPy]_3$. Suitable high molecular weight materials include polymers preferably those having substantially conjugated backbone (main chain), such as polythiophenes, polyphenylenes, polythiophenevinylenes, polyphenylenevinylenes, polyalkylfluorenes. In the present invention the term polymer includes homopolymer, copolymer, terpolymer and higher homologous as well as oligomers. Examples of such materials are given in U.S. Pat. No. 5,708,130, WO97/39082, WO96/10598.

The electroluminescent layer preferably has an average thickness of from 50 to 200 nm, more preferably from 60 nm to 150 nm.

The electron blocking layer (hole injection electrode) is suitably made of a metal or an alloy having a high work function such as Au, Pt, Ag. Preferably, a more transparent electron blocking layer (hole injection electrode) material such as an indium tin oxide (ITO) is used. Conductive polymers such as polyaniline (PANI) and a poly-3,4-ethylenedioxythiophene (PEDOT) are also suitable transparent hole-injection electrodes. Preferably, the electron blocking layer (hole injection electrode) has a thickness of from 50 to 300 nm.

Hole-injecting and hole-transporting layer materials include soluble phthalocyanine compounds, triarylamine compounds, electroconductive polymers, perylene compounds, and europium complexes.

Electron-injecting and electron-transporting layer materials include Alq3, azomethine zinc complexes, and distyrylbiphenyl derivatives. These are however not exhaustive.

The electron injection electrode is preferably made of a metal or an alloy having a low work function, such as Yb, Ca, Al, Mg:Ag, Li:Al, Ba or is a laminate of different layers such as Ba/Al or Ba/Ag electrode.

Dopants used in the invention may be compounds such as 3-(2-Benzothiazolyl)-7-diethylaminocoumarin (Coumarin 6), europium complexes, ruthenium complexes, Rhodamine salts, platinum complexes, iridium complexes and Nile red although this list is not exhaustive.

Insulators used in the invention may be inorganic or organic or a composite of the two. It is preferred that the insulator is solution coated enabling ambient processing. When the insulator is being patterned, it may perform the function of a blocking layer between OLED materials. The insulator may be any organic polymer or polymer precursor, optionally containing inorganic particles. The insulator can be spray-, dip-, web- or spin coated or deposited by any liquid coating technique. Any liquid carrier may be employed as long as it does not dissolve the ink.

The invention will now be further described by way of example and with reference to the accompanying drawings in which:

FIG. 2(a) shows a pattern for a blocking layer to be printed between two layers of the OLED device to produce a simple grey-scale image;

FIG. 2(b) shows the resultant grey-scale image in the operating OLED produced by the pattern in FIG. 2(b);

FIG. 3 shows a pseudo 3-D image by use of grey-scale shading;

Figure 1:
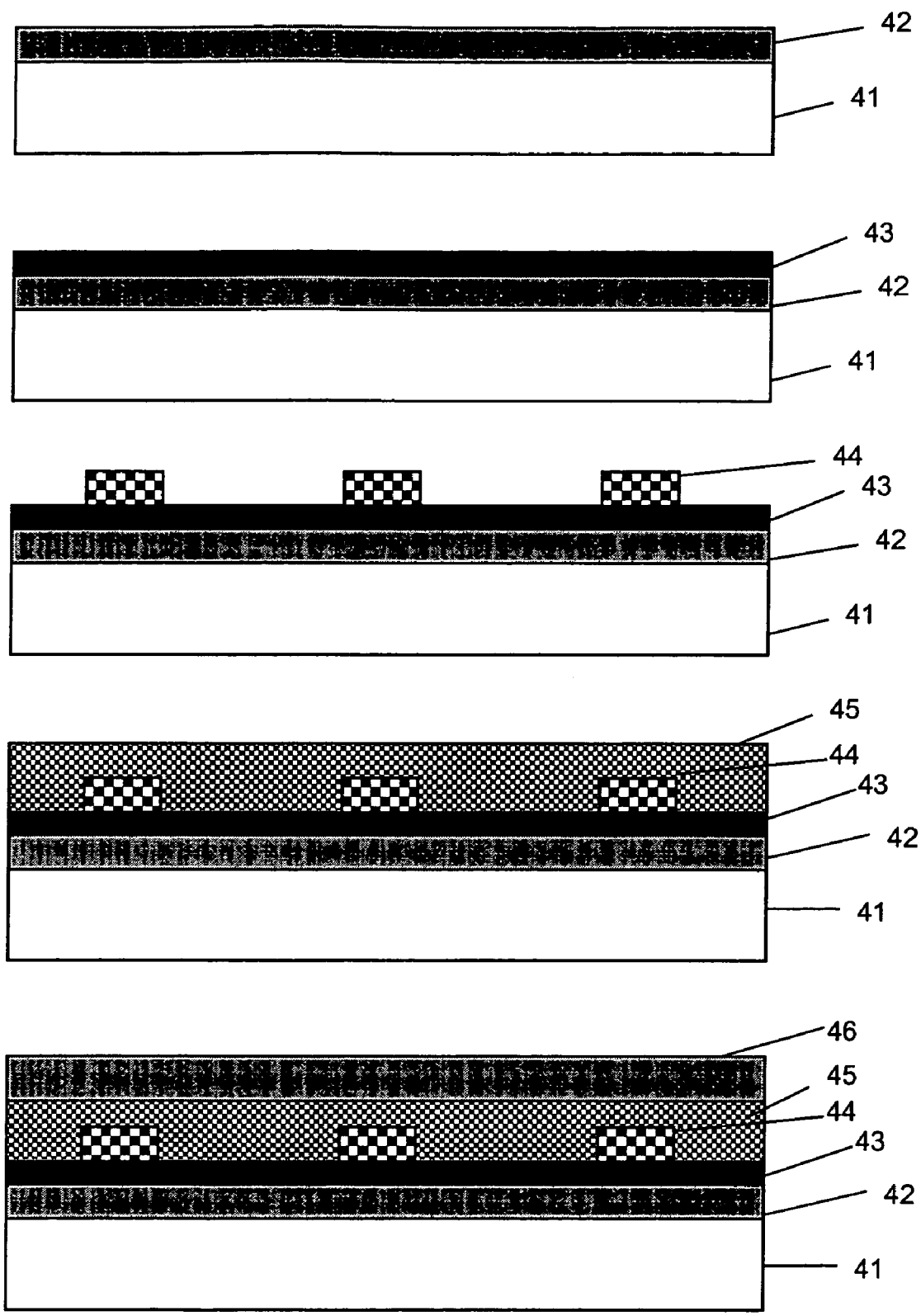
FIG. 1 shows the patterning of an ink which is used to block the movement of charge into the electroluminescent layer.

FIG. 1 shows the patterning of an ink which is used to block the movement of charge into the electroluminescent layer, thereby allowing a patterned OLED to be constructed. A layer of metal (42) forming an anode is deposited on a substrate (41) by evaporation or sputtering. A conductive polymer layer (43) is then applied by spin coating. The blocking ink (44) is patterned in areas where the device is not to emit light. Following this the electroluminescent layer (45) is deposited by spin coating or evaporation on top of the ink. Finally a cathode layer is deposited (46). Alternative examples can be envisaged where the blocking ink is deposited upon a different layer of the device such as the electroluminescent layer or anode. The use of the blocking layer in areas where the device is not to emit light improves the contrast between the emitting areas and the "background". If the ink is coloured, preferably a dark colour, the contrast is further improved.

In a further embodiment of the invention a blocking layer is used within the OLED in such a way that the emission is modulated progressively from dark to bright across the area of the OLED device. The blocking layer is printed in a series of discretely placed ink drops (or electrophotographic toner), typically each less than 100 μm in size, the density of which determines the output brightness of the OLED in that area (see scheme in FIGS. 2(a) and (b)). In FIG. 2(a), the blocking layer is printed with a high dot density at the top of the display changing progressively to a low dot density at the bottom of the display. This "grey-scale" patterning of the blocking layer allows contrast to be created in an image (as shown in FIG. 2(b)) without the need for sophisticated driving electronics such as active matrix transistor backplanes. As such this will dramatically reduce the cost of producing grey-scale images in OLEDs.

Grey-scale patterning is advantageous in a display application as it allows a depth of image or "pseudo 3-D image" to be conveyed to the viewer from a 2 dimensional source i.e. flat plane. An example of this application is shown in FIG. 3 in which the "AVECIA" name is presented as a pseudo 3-D image by use of grey-scale shading. The "front" of the letters is produced by areas with no or low dot density so it appears bright and the "side" of the letters is produced by areas with higher dot density so they appear darker, thus giving the impression of 3-D.

Uses of grey-scale patterning of OLEDs are numerous and include, without limiting to these examples, company logos, user interfaces on machines, displays on electronic devices, artwork, light-emitting wallpaper etc.

EXAMPLE 1

Simple Blocking Layer

Figure 4:
FIG. 4 shows a pattern printed onto PEDOT using ink that serves as a blocking layer.
Figure 5:
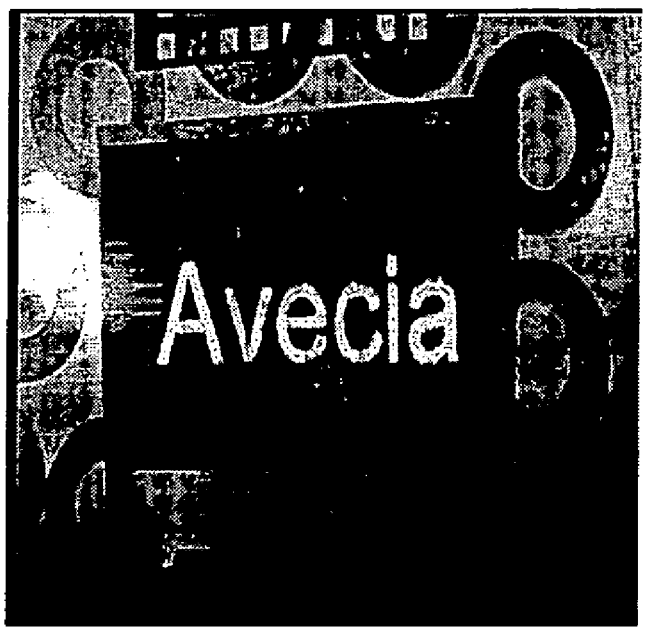
FIG. 5 shows the areas of PEDOT from FIG. 4 which had no ink upon them emitting light with all other areas blocked by the ink-jet printed layer.

An ITO coated polyester substrate was cleaned in an air plasma for 20 s using a voltage of 5 kV. Following this, a water dispersion of poly(3,4-ethylenedioxythiophene)/poly(styrenesulfonate) (PEDOT) (Baytron P CH8000) was deposited and spun at 1000 rpm for 20 s to give a layer of approximately 100 nm in thickness. This was dried in an oven at 100° C. for 5 minutes. The pattern (FIG. 4) was printed onto the PEDOT using ink that served as a blocking layer. After printing on the PEDOT the sample was baked at 100° C. for 1 minute. A quantity of "super yellow" PPV (Covion SY-17) formulated at 0.5% (wt.) in toluene was deposited on the substrate and spun at 1000 rpm for 30 s to give an approximately 70 nm layer. The sample was dried at 100° C. for 20 minutes to evaporate the solvent. An aluminium cathode was deposited onto the sample by thermal evaporation of the metal, through a plastic shadow mask, under vacuum. To test the efficiency of patterning, contacts were made to the ITO and aluminium and the appropriate connections made to a function generator which supplied a 20V square wave signal at low frequency (~5 Hz). The areas of PEDOT which had no ink upon them emitted light and the remaining areas were blocked by the ink-jet printed blocking layer as shown in FIG. 5. This demonstrates a method whereby an OLED is patterned using a standard inkjet ink but has the added advantage of creating extra contrast due to the black background.

EXAMPLE 2

Patterning Grey-Scale Images

Figure 6A:
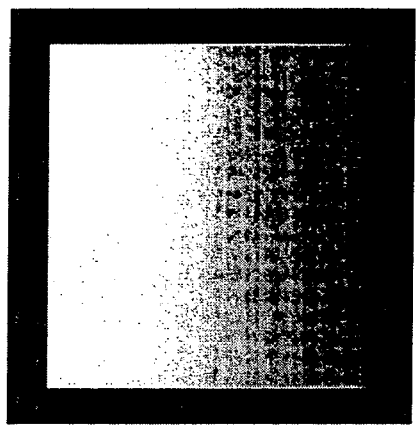
FIG. 6(a) shows a grey-scale test pattern for a blocking layer.
Figure 6B:
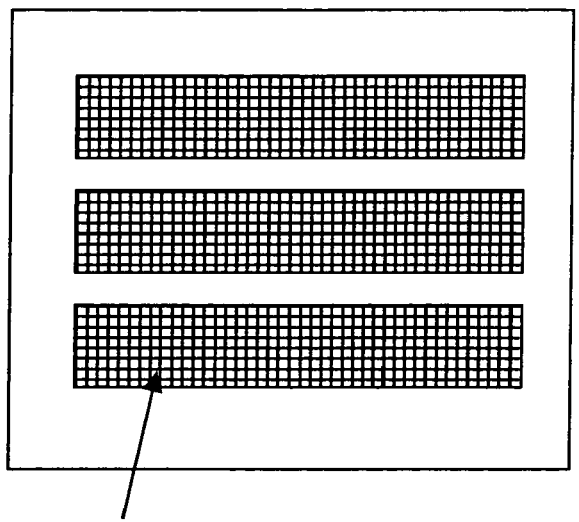
FIG. 6(b) shows a shadow mask geometry.
Figure 7:
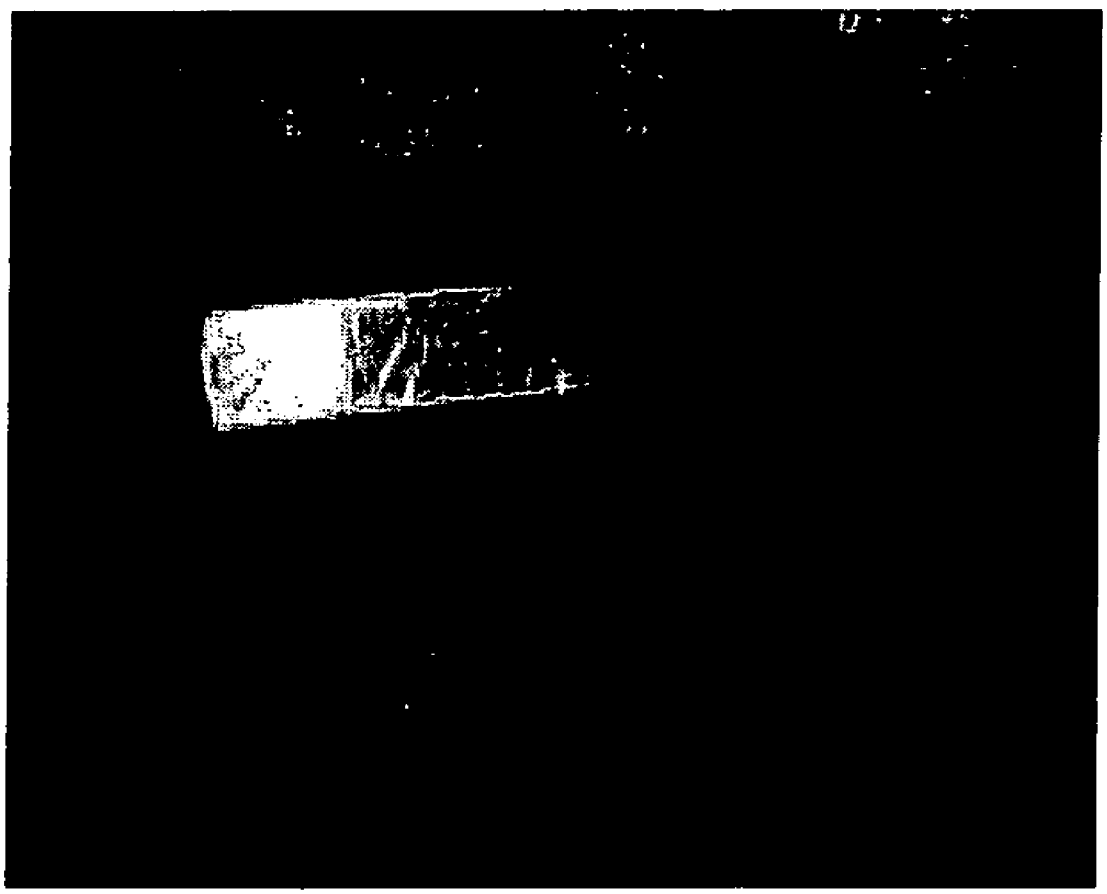
FIG. 7 shows a grey-scale OLED device produced using the grey-scale test pattern and shadow mask of FIGS. 6(a) and (b)

An ITO coated polyester substrate was cleaned in an air plasma for 30 s using a voltage of 5 kV. Following this, a water dispersion of poly(3,4-ethylenedioxythiophene)/poly(styrenesulfonate) (PEDOT) (Baytron P CH8000) was deposited and spun at 1000 rpm for 20 s to give a layer of approximately 100 nm in thickness. This was dried in an oven at 100° C. for 5 minutes. The grey-scale pattern (FIG. 6(a)) was printed onto the PEDOT using ink that served as a blocking layer. After printing on the PEDOT the sample was baked at 100° C. for 1 minute. A quantity of "super yellow" PPV (Covion SY-17) formulated at 0.5% (wt.) in toluene was deposited on the substrate and spun at 1000 rpm for 30 s to give an approximately 70 nm layer. The sample was dried at 100° C. for 20 minutes to evaporate the solvent. The aluminium cathode was deposited onto the sample by thermal evaporation of the metal, through a plastic shadow mask as shown in FIG. 6(b), under vacuum. This produced an aluminium cathode in a horizontal strip. To test the efficiency of patterning, contacts were made to the ITO and aluminium and the appropriate connections made to a power supply. Applying a voltage to the device resulted in light being emitted. The brightest area corresponded to the area where little or no ink was printed and then the image became progressively darker across the device until no light was emitted from the area which had the most ink printed. The resulting image of the working device can be seen in FIG. 7. The far left of the illuminated device in FIG. 7 corresponds to the area that received little or no ink and progressively towards the far right the density of ink increases and so appears dark.

EXAMPLE 3

Figure 8:
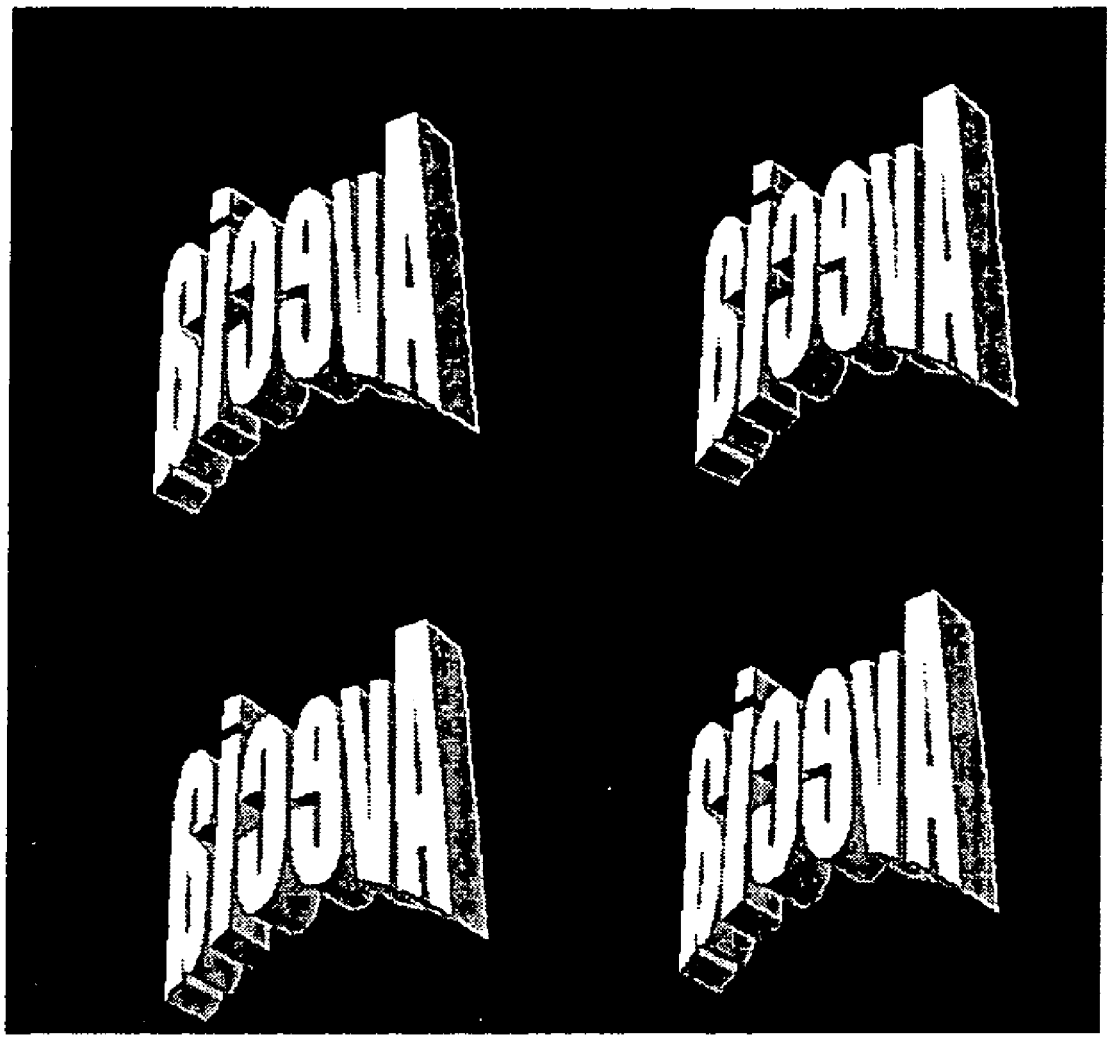
FIG. 8 shows a "pseudo 3-D" grey-scale pattern for a blocking layer.
Figure 9:
FIG. 9 shows an image of a 3-D logo produced using the grey-scale shading of the pattern in FIG. 8.

A further device was made using the same method as Example 2 but where the ink pattern was printed in a "pseudo 3-D" pattern as shown in FIG. 8. An image of the working device can be seen in FIG. 9.

The invention claimed is:

1. A method of forming an OLED element or display having two or more OLED layers, one of which is an electroluminescent layer, which method comprises providing a blocking layer that prevents conduction and movement of any charge into the electroluminescent layer by printing with an ink that prevents conduction and movement of any charge into the electroluminescent layer in a desired pattern between two of the OLED layers wherein one of the layers is the electroluminescent layer and the other layer is a hole-injection or hole-transport layer, whereby, in use, conduction across the OLED element or display is reduced in the area of the pattern.

2. A method of forming an OLED element or display as claimed in claim 1 wherein the ink is coloured to increase contrast.

3. A method of forming an OLED element or display as claimed in claim 1 wherein the blocking layer pattern comprises a multiplicity of discrete points of ink.

4. A method of forming an OLED element or display as claimed in claim 3 wherein the discrete points of ink are less than about 100 μm in size.

5. A method of forming an OLED element or display as claimed in claim 3 or 4 wherein the pattern comprises regions with different densities of the discrete points.

6. A method of forming an OLED element or display as claimed in claim 1 wherein the ink is insoluble in the medium used to deposit underlying and/or overlying OLED layers.

7. A method of forming an OLED element or display as claimed in claim 1 wherein the ink comprises a medium which is a liquid which does not dissolve the layer on which the ink is printed.

8. A method of forming an OLED element or display as claimed in claim 1 wherein the ink further comprises a colorant, a polymeric binder and/or functional additives.

9. A method of forming an OLED element or display as claimed in claim 1 wherein the ink is deposited by a direct printing technique selected from ink-jet printing, screen printing, microcontact printing, stamping, soft lithography or electrophotographic printing using a liquid or solid toner.

10. A method of forming an OLED element or display as claimed in claim 9 wherein the ink is deposited by ink-jet printing.

11. A method of forming an OLED element or display as claimed in claim 1 wherein the ink blocking layer is thicker than the OLED layer(s) subsequently deposited onto it.

12. A method of forming an OLED element or display as claimed in claim 1 wherein the ink blocking layer thickness is from 100 nm to 100 μm thick.

13. A method of forming an OLED element or display as claimed in claim 1 wherein the OLED layer(s) to be deposited are independently applied by a coating or printing technique selected from solution-, spin-, spray-, dip-, web-, die- or evaporation coating: electroless deposition and ink-jet printing, screen printing, microcontact printing, stamping or soft lithography.

14. A method of forming an OLED element or display as claimed in claim 1 wherein the wetting of the ink includes a surface treatment of the layer on which the ink is deposited.

15. An OLED element or display obtainable by a method as claimed in claim 1.

16. An OLED display as claimed in claim 15 which, in use, produces a pseudo 3-D image.

* * * * *